United States Patent
Otsuki

(10) Patent No.: US 7,279,376 B2
(45) Date of Patent: Oct. 9, 2007

(54) METHOD FOR MANUFACTURING SEMICONDUCTOR DEVICE

(75) Inventor: Kazutaka Otsuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 318 days.

(21) Appl. No.: 10/998,947

(22) Filed: Nov. 30, 2004

(65) Prior Publication Data

US 2005/0142808 A1 Jun. 30, 2005

(30) Foreign Application Priority Data

Dec. 26, 2003 (JP) .............................. 2003-431807

(51) Int. Cl.
*H01L 21/76* (2006.01)
(52) U.S. Cl. ...................... 438/221; 438/296; 438/427; 438/700
(58) Field of Classification Search ................ 438/427, 438/221, 296, 359, 700
See application file for complete search history.

(56) References Cited

U.S. PATENT DOCUMENTS

| | | | | |
|---|---|---|---|---|
| 5,674,775 A * | 10/1997 | Ho et al. | ..................... | 438/296 |
| 5,677,233 A | 10/1997 | Abiko | | |
| 6,150,234 A * | 11/2000 | Olsen | ......................... | 438/424 |
| 6,406,976 B1 * | 6/2002 | Singh et al. | ................ | 438/423 |
| 6,440,816 B1 * | 8/2002 | Farrow et al. | ............... | 438/401 |
| 6,949,801 B2 * | 9/2005 | Parat et al. | ................. | 257/374 |
| 6,995,095 B2 * | 2/2006 | Yu | .............................. | 438/750 |
| 7,078,286 B1 * | 7/2006 | Mehta | ......................... | 438/221 |
| 7,087,498 B2 * | 8/2006 | Pita et al. | .................... | 438/359 |
| 2002/0190342 A1 * | 12/2002 | Hur | ............................. | 257/499 |
| 2003/0045071 A1 * | 3/2003 | Hong et al. | ................. | 438/427 |
| 2003/0211702 A1 * | 11/2003 | Parat et al. | ................. | 438/424 |
| 2006/0220171 A1 * | 10/2006 | Choi et al. | .................. | 257/500 |

FOREIGN PATENT DOCUMENTS

| | | |
|---|---|---|
| JP | 60-92632 | 5/1985 |
| JP | 2001-168184 | 6/2001 |

* cited by examiner

*Primary Examiner*—Zandra V. Smith
*Assistant Examiner*—Toniae M Thomas
(74) *Attorney, Agent, or Firm*—McGinn IP Law Group, PLLC

(57) ABSTRACT

The present invention provides a technology for forming the trenches having different depths in one semiconductor substrate, which enables easily conducting the photo resist process employed for the etch process and forming trenches at higher depth dimension accuracy. The openings of the first films are formed in the semiconductor substrate to expose surfaces of the semiconductor substrate, the semiconductor substrate is etched through the openings to a depth of the shallower trench and then the cell region is covered with the second photo resist pattern, and the peripheral region is etched through the first films to form the deeper trench. Since the etch process is conducted under the conditions, in which the surfaces of the semiconductor substrate are exposed (opened) within the openings in the first film, trenches having different depths can be formed with higher depth dimension accuracy by suitably controlling the etch conditions.

20 Claims, 9 Drawing Sheets

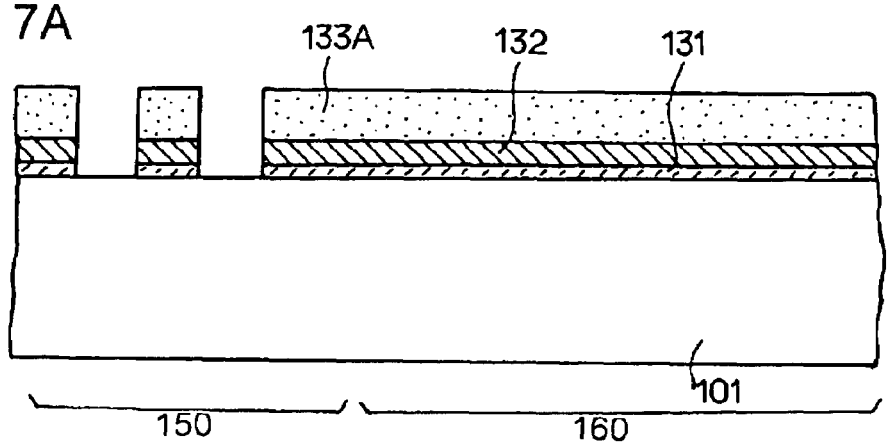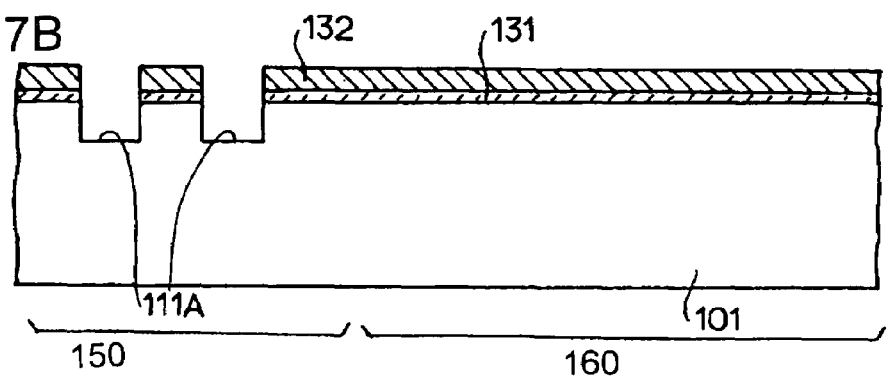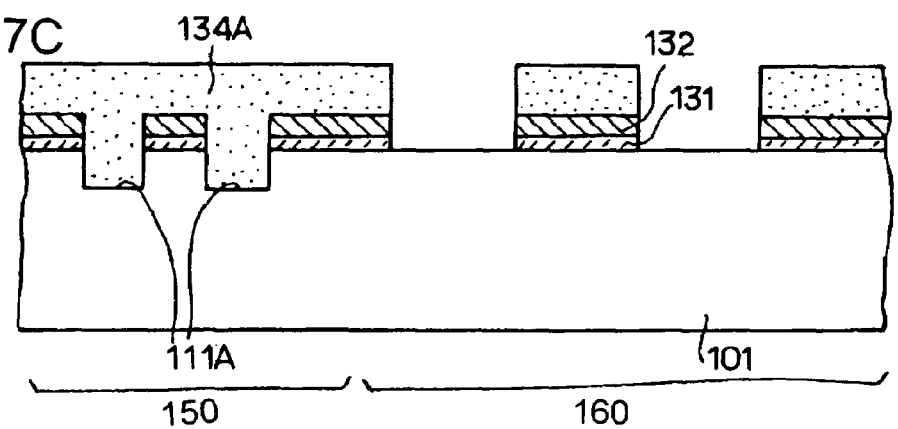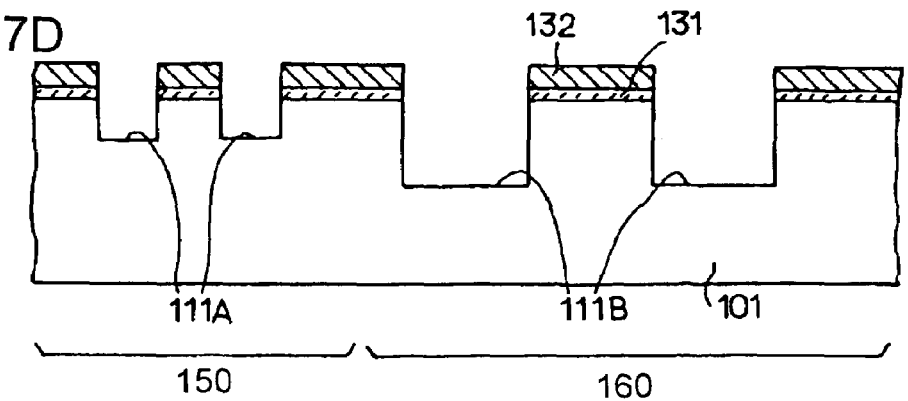

PRIOR ART

METHOD FOR MANUFACTURING SEMICONDUCTOR DEVICE

This application is based on Japanese Patent Application NO.2003-431807, the content of which is incorporated hereinto by reference.

BACKGROUND OF THE INVENTION

1. Field of the Invention

The present invention relates to a semiconductor device comprising a shallower trench and a deeper trench in one semiconductor substrate, and more particularly relates to a method for manufacturing a semiconductor device, which enables to form a shallow trench with higher depth dimension accuracy.

2. Related Art

In semiconductor devices such as memory and the like, a cell region and a peripheral region are typically disposed on one semiconductor substrate, and these regions are driven at different voltages. In such semiconductor device, a device isolation insulating film for isolating devices formed in each of the regions is required to be designed corresponding to the driving voltages. More specifically, in the peripheral region utilizing higher driving voltage, the film thickness of the device isolation insulating film is thicker in order to ensure maintaining sufficient breakdown voltage resistance for device isolation, and in the cell region utilizing lower driving voltage, the film thickness of the device isolation insulating film is thinner in order to achieve a miniaturization of the device rather than ensuring sufficient breakdown voltage resistance for device isolation. Particularly in recent years, shallow trench isolation (STI) insulating film provided by forming a trench on the semiconductor substrate and filling thereof with an insulating film is proposed, and when the STI is employed for the device isolation, STI having relatively deeper trench is formed in the peripheral region and STI having relatively shallower trench is formed in the cell region.

As such, it is required to form respective trenches having respective depths, in order to form semiconductor devices including STI having different depths on one semiconductor substrate. A technology for forming trenches having such different depths is disclosed in Japanese Patent Laid-Open No. 2001-168184. This technology will be described in reference to FIGS. 8A to 8D. As shown in FIG. 8A, a silicon oxide film 231 and a silicon nitride film 232 are consecutively formed on a silicon substrate 201; a part of the silicon nitride film 232 around a peripheral region 260 for forming deeper STI is etched through a first photo resist pattern 233 to form openings; the silicon oxide film 231 is etched through the silicon nitride film 232 as a mask, and further, the silicon substrate 201 is etched to a predetermined depth to form trenches 211Ba. Then, as shown in FIG. 8B, a second photo resist pattern 234 is formed, where the widths of the openings thereof are wider than that of the first photo resist pattern 233 to reduce the line width dimension in the peripheral region 260 for forming deeper STI. Then, the silicon nitride film 232 is etched through the second photo resist pattern 234. Then, as shown in FIG. 8C, the silicon oxide film 231 is etched through the mask of the silicon nitride film 232, and further the silicon substrate 201 is etched. Thereafter, as shown in FIG. 8D, the silicon oxide film 231 and the silicon nitride film 232 are removed to form trenches 211A and 211B having different depths in one silicon substrate 201. In this case, as shown in FIG. 8C, since the trenches 211Ba, which have been etched, are further etched to form a deeper depth in the peripheral region 260 having the deeper STI formed thereon, the trenches 211B are formed to have a deeper depth than the trenches 211A formed via an etching in the cell region 250 for forming shallow STI.

In the technology described in Japanese Patent Laid-Open No. 2001-168184, when the second photo resist pattern 234 is formed, it is necessary to conduct an alignment of the pattern of the silicon nitride film 232 formed through the first photo resist pattern 233 with higher accuracy. It is necessary to align the second photo resist pattern 234 with higher accuracy, particularly in the case of semiconductor devices that require further miniaturization, and thus a problem of unwantedly providing a complicated process for manufacturing the second photo resist pattern 234 is arisen.

On the other hand, Japanese Patent Laid-Open No. 1985-92632 discloses a technology, in which the required accuracy for aligning the second photo resist pattern process can be reduced. In this technology, firstly as shown in FIG. 9A, a phosphor silicate glass (PSG) film 331 and a silicon oxide film 332 are formed consecutively on a surface of a silicon substrate 301. A first photo resist pattern 333 is formed, and the silicon oxide film 332 in regions for forming STI is partially etched through the first photo resist pattern. Next, as shown in FIG. 9B, the second photo resist pattern 334 is formed to cover the cell region 250, and then the PSG film 331 in the peripheral region 260 is partially etched. In this occasion, since the silicon substrate 301 is also slightly etched, trenches 311Ba having a predetermined depth are simultaneously formed. Subsequently, as shown in FIG. 9C, the second photo resist pattern 334 is removed, and thereafter, the remaining portions of the PSG film 331 are etched through a mask of the silicon oxide film 332, and the silicon substrate 301 is additionally etched to further etch the trenches 311Ba that have been previously formed in the peripheral region 260, thereby forming deeper trenches 311B. In addition, trenches 311A are also formed in the cell region 250, and in this case, since the PSG film 331 should be etched off before etching the silicon substrate in an early stage of the etch process, the etch depth of the silicon substrate 301 is slightly reduced as a trade-off of the etching of the PSG film, and therefore the trenches 311A are formed as relatively shallower trenches. Thereafter, as shown in FIG. 9D, the silicon oxide film 332 and the PSG film 331 are removed to form trenches 311A and 311B having different depths on one silicon substrate 301. Since the function of the second photo resist pattern 334 is to only cover the cell region in the technology disclosed in Japanese Patent Laid-Open No. 1985-92632, the required accuracy for aligning thereof may be lower in comparison with the technology disclosed in Japanese Patent Laid-Open No. 2001-168184, and thus a simple masking process can be utilized.

Another type of technology is also proposed, in which the PSG film and the silicon oxide film utilized in the technology of Japanese Patent Laid-Open No. 1985-92632 are replaced with the silicon oxide film and the silicon nitride film, respectively, similarly as in Japanese Patent Laid-Open No. 2001-168184. Since this technology is substantially similar to the technology of Japanese Patent Laid-Open No. 1985-92632, the illustration in reference to figures is not presented here. The process is as follows. Silicon nitride films in a peripheral region and a cell region for forming STI are partially etched through a mask of a first photo resist pattern, and thereafter, the cell region is coated through a mask of a second photo resist pattern, and then only portions of a silicon oxide film in the peripheral region are removed to partially expose the silicon substrate. Then, an etch process is conducted for the peripheral region and the cell region, where only the silicon substrate is etched in the peripheral region and the silicon oxide film and the silicon substrate are etched in the cell region. The trenches in the cell region are shallower than the trenches in the peripheral region, since the etch amount in etching the silicon substrate is reduced by an amount of etching the silicon oxide film in the cell region. The required accuracy for aligning the second photo resist in the masking process can also be reduced even in this technology.

SUMMARY OF THE INVENTION

It can be recognized that the technology disclosed in Japanese Patent Laid-Open No. 1985-92632 is somewhat better than the technology disclosed in Japanese Patent Laid-Open No. 2001-168184, in the sense that the required accuracy in the alignment during the formation of the second photo resist pattern can be reduced to provide an easy patterning. However, the technology disclosed in Japanese Patent Laid-Open No. 1985-92632, on the contrary, requires that, in order to form the shallower trenches in the cell region that the trenches in the peripheral region, the PSG film is first etched, and successively, the silicon substrate is etched to form the trenches. Since the underlying PSG film is slightly etched in the etch process for the silicon oxide film in the process step conducted prior to the above described process, a variation in the film thickness of the PSG film is caused depending upon the etch conditions. Therefore, the etch amount for the silicon substrate fluctuates according to the variation in the film thickness of the PSG film when the PSG film and the silicon substrate are sequentially etched, and thus variation in the depth of the trench is, in turn, occurred. Such variation in the depth of the trench is remarkable in the cell region for forming the shallower trenches, and the variation in the depth of the trenches will be a disadvantageous matter in achieving the miniaturization in the cell region. Such variation of the depth of the trenches is also similarly occurred in the technology disclosed in Japanese Patent Laid-Open No. 2001-168184, since the silicon substrate is etched simultaneously with the etch of the silicon oxide film when the shallower trenches are formed.

According to the present invention, there is provided a method for manufacturing a semiconductor device, comprising: forming a first film having a plurality of opening patterns on a surface of a semiconductor substrate; providing a plurality of the openings on the first film to expose the surface of the semiconductor substrate; etching the semiconductor substrate through the plurality of the openings to form a trench in a portion of the semiconductor substrate; covering some of the openings of the plurality of the openings; and further etching at least a portion of the semiconductor substrate, in which the trench is formed, through some other openings of the plurality of the openings to form a trench being deeper than the trench.

According to the present invention, it is characterized in that the surface of the semiconductor substrate is partially exposed when an opening is provided in the first film, and since the exposed surface of the semiconductor substrate is etched in order to form the trench, a deeper trench with higher depth dimension accuracy in the depth direction can be formed by suitably controlling the etch conditions. This configuration can provide shallower STI formed with highly controlled depth in the cell region, when STI having different depths in respective regions of the semiconductor device that includes the cell region and the peripheral region are formed by the manufacturing method according to the present invention, and thus the configuration thereof is preferable for achieving the miniaturization in the cell region. In addition, deeper STI can be formed in the peripheral region that utilizes higher voltage of electric power, and thus better breakdown voltage resistance for device isolation at higher voltage as designed can be obtained.

In addition, while the alignment in the position of the opening with the higher accuracy in the process for providing the opening in the first film is required according to the present invention, the alignment in the position of the previously-provided opening with the higher accuracy in the process for partially coating the opening is not required, and thus the manufacturing process thereof can easily be conducted.

According to the present invention, there is provided a method for manufacturing a semiconductor device, comprising: forming a first film having an opening pattern on a surface of a semiconductor substrate; providing an opening on a portion of the first film to expose the surface of the semiconductor substrate; etching a portion of the semiconductor substrate through the opening to form a trench; covering the opening while providing an other opening in one portion of the first film to partially expose a surface of the semiconductor substrate; and etching the semiconductor substrate through the other opening to form a deeper trench than the trench.

According to the present invention, it is characterized in that the surface of the semiconductor substrate is partially exposed when an opening is provided in the first film, and since the exposed surface of the semiconductor substrate is etched in order to form the trench, a deeper trench with higher depth dimension accuracy in the depth direction can be formed by suitably controlling the etch conditions. This configuration can provide shallower STI formed with highly accurate depth dimension in the cell region, when STI having different depths in respective regions of the semiconductor device that includes the cell region and the peripheral region are formed by the manufacturing method according to the present invention, and thus the configuration is preferable for achieving the miniaturization in the cell region. In addition, deeper STI can be formed in the peripheral region that utilizes higher voltage of electric power, and thus better breakdown voltage resistance for device isolation at higher voltage as designed can be obtained.

According to the present invention, the opening is provided in the first film to partially expose the surface of semiconductor substrate, so that variation in the depths of the trenches provided on the semiconductor substrate can be reduced while the miniaturization of the semiconductor device is achieved.

BRIEF DESCRIPTION OF THE DRAWINGS

The above and other objects, advantages and features of the present invention will be more apparent from the following description taken in conjunction with the accompanying drawings, in which:

FIGS. 7A to 7D are cross-sectional views of a semiconductor device according to the third embodiment of the present invention, showing a manufacturing process for the semiconductor device according to the third embodiment;

DETAILED DESCRIPTION OF THE INVENTION

Figure 1:
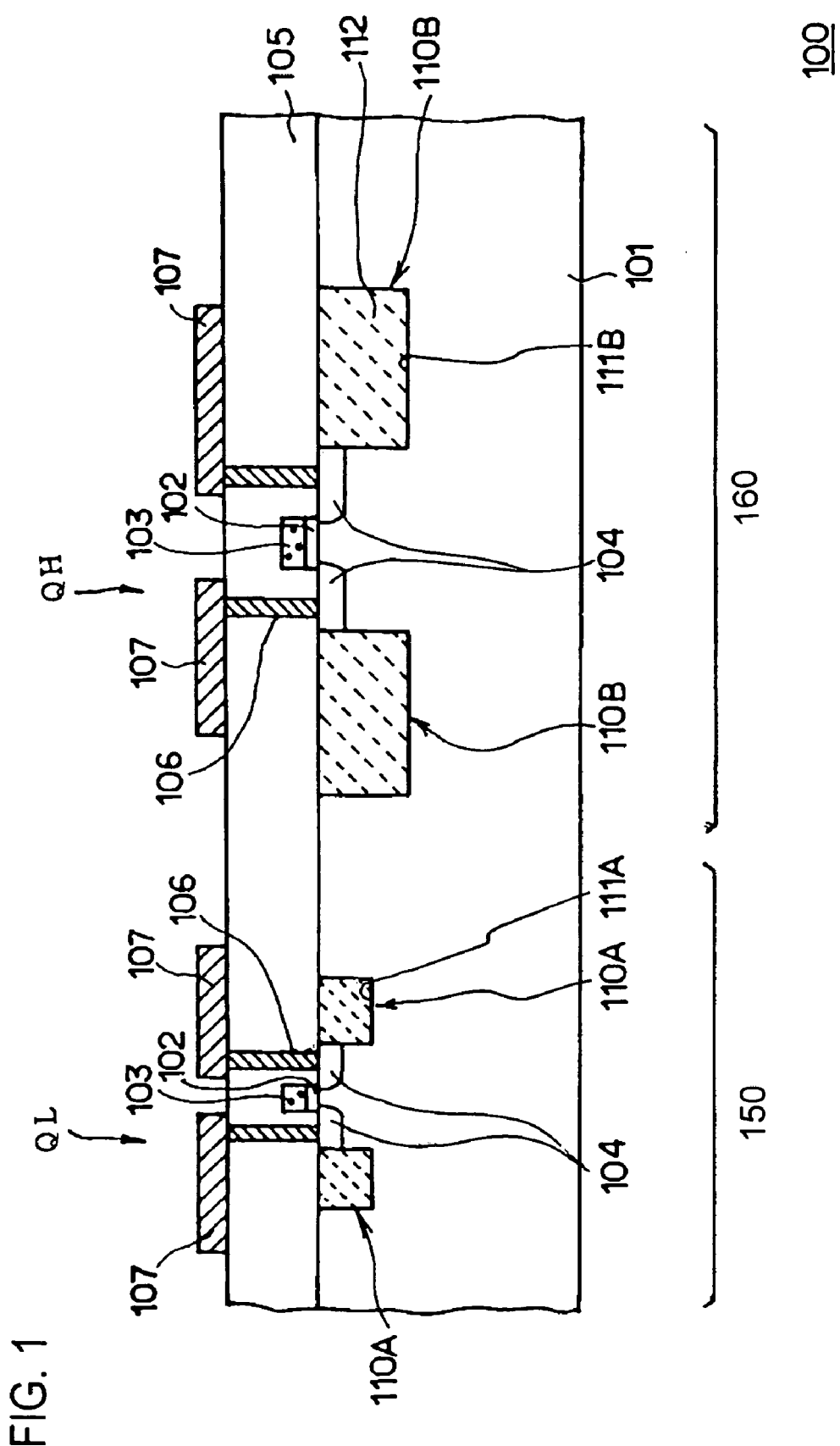
FIG. 1 is a cross-sectional view of a semiconductor device according to the first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described in reference to the annexed figures as follows. In all figures, similar numeral is assigned to a similar element, and the detailed description thereof is not presented.

In the present invention, a process for forming a first film may preferably include a process for depositing a silicon oxide film and a silicon nitride film consecutively on a surface of a semiconductor substrate, a process for providing openings in the first film may preferably include a process for etching the first film through a first photo resist pattern, and a process for covering some of the openings may preferably include a process for forming a second photo resist pattern on the first film.

The present invention may additionally be characterized in including forming side walls on the side surfaces of the openings of the first film to reduce the width dimension of the openings.

In the present invention, the process for forming the side walls may preferably include a process for forming the second film on the entire surface of the semiconductor substrate and a process for conducting an anisotropic etch for the formed second film to partially leave the second film only on the side surfaces of the openings.

In the present invention, a process for forming a first film may preferably include a process for depositing a silicon oxide film and a silicon nitride film consecutively on a surface of a semiconductor substrate, a process for providing openings in a portion of the first film may preferably include a process for etching a portion of the first film through a first photo resist pattern, and a process for covering some of the openings and providing openings in some other portions of the first film may preferably include a process for etching the some other portions of the first film through a second photo resist pattern formed on the first film.

In the present invention, the process for providing the openings in the first film may be typically conducted under a condition, in which the etching of the first film is conducted at an etch rate of around two or three folds of an etch rate for etching the semiconductor substrate. In this case, the process for providing the opening may typically employ a manner for detecting an end point of the etching of the first film, and an over etching thereof may be typically conducted for a predetermined time after detecting the end point of the etching.

The present invention may preferably include a process for forming a shallow trench isolation (STI) by forming insulating films embedded within shallower and deeper trenches that have been formed by the above-described method for manufacturing the semiconductor device. In this case, a process for forming the STI may typically include a process for depositing an insulating film within a trench via a chemical vapor deposition (CVD) and a process for planarizing a surface of the deposited insulating film via a chemical mechanical polishing (CMP). In particular, the semiconductor substrate may comprise a cell region composed of a cell device and a peripheral region composed of a high breakdown voltage resistance device, and it is preferable to form the STI with shallower trenches in the cell region and the STI with deeper trenches in the peripheral region.

FIRST EMBODIMENT

A semiconductor device according to the present embodiment will be described in reference to the annexed figures as follows. FIG. 1 is a schematic cross-sectional view of a semiconductor device according to the present embodiment. The present embodiment illustrates an example of applying the present invention to a memory device 100, and a peripheral region 160 is provided in a portion of a silicon substrate 101 that is the semiconductor substrate, and a cell region 150 composed of a memory cell that is the cell device is provided in other portion thereof. A higher breakdown voltage resistance MOS transistor QH, which is the high breakdown voltage resistance device, is formed in the peripheral region 160, as a device that is driven at a source voltage equivalent to or higher than a source voltage for a device (not shown in the drawings) in the cell region 150 driven at a lower source voltage, and a cell MOS transistor QL is formed as a device that is driven at lower source voltage than that of the higher breakdown voltage resistance MOS transistor QH in the cell region 150.

Each of the MOS transistor QH and the MOS transistor QL comprises a gate insulating film 102, a gate electrode 103 and a source drain diffusion layer 104, provided that numerals are unified in both transistors, and detailed description thereof is not presented. In addition, STI 110A and STI 110B for isolating the respective devices (MOS transistors) are formed in the peripheral region 160 and in the cell region 150, respectively. The relatively shallower STI 110A are formed in the cell region 150, and the relatively deeper STI 110B are formed in the peripheral region 160. The STI 110A and the STI 110B are formed by growing silicon oxide films 112 within the insides of the trenches 111A and the trenches 111B, which are formed via the etching process in the silicon substrate 101, respectively, to fill the trenches, and then polishing the surface thereof flatly. In addition, an interlayer insulating film 105 is formed on the upper surface of the silicon substrate 101 in the memory device 100, and burried contacts 106 for providing electrical couplings to the source drain diffusion layers 104 are formed in the interlayer insulating film 105 to electrically couple to metal interconnects 107 that are formed on the interlayer insulating film 105 with predetermined patterns.

Figure 2A:
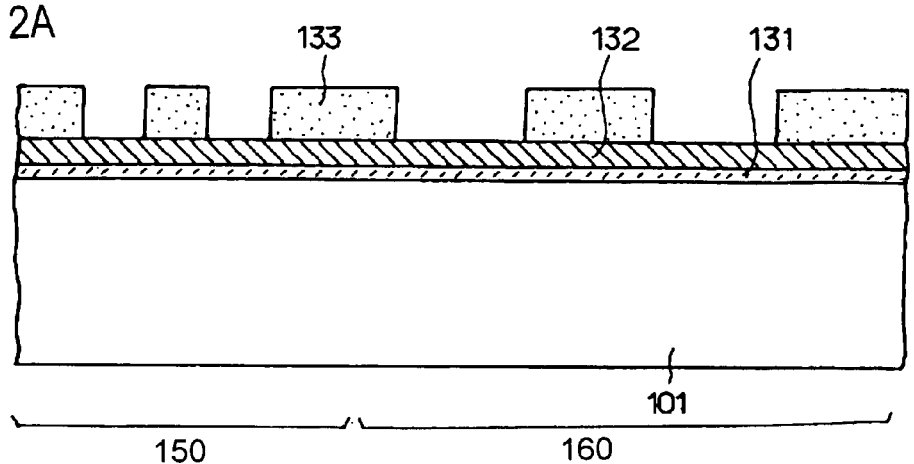
FIGS. 2A to 2C are cross-sectional views of a semiconductor device according to the first embodiment of the present invention, showing a manufacturing process for the semiconductor device according to the first embodiment.

FIGS. 2A to 2C and FIGS. 3A to 3C are cross sectional views, showing the process sequence of the method for manufacturing the memory device 100 shown in FIG. 1. First, as shown in FIG. 2A, a thin silicon oxide film 131 having a thickness of about 10 nm is formed on the surface of the silicon substrate 101 via a first oxidization process, and a silicon nitride film 132 having a thickness of about 150 nm is formed thereon via a CVD process or the like. Then, first photo resist patterns 133 as the first film, which function as a mask in the photo resist process, and have openings (apertures) provided at locations for forming STI, is formed on the silicon nitride film 132. Spacings in the first photo resist pattern 133 may be about 150 nm in the cell region 150, and may be at various values but at least about 300 nm in the peripheral region 160.

Figure 2B:
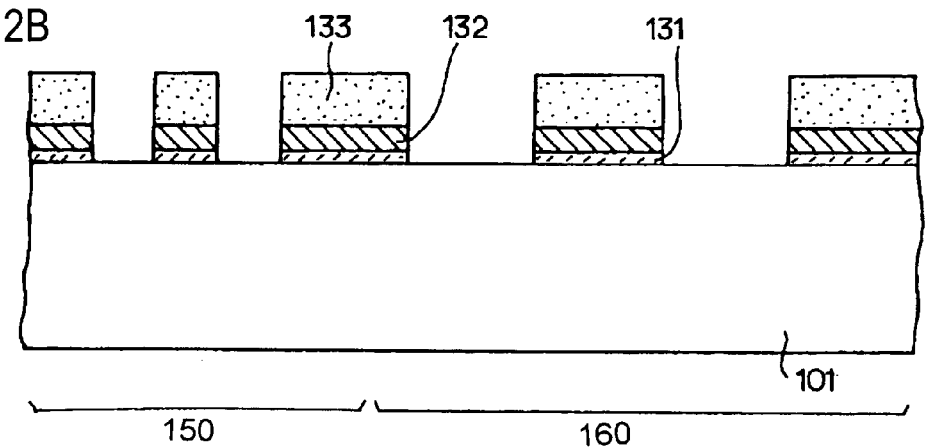

Then, as shown in FIG. 2B, the silicon nitride film 132 and the silicon oxide film 131 are sequentially etched off thorough a mask of the first photo resist pattern 133 via a plasma etching or the like to form a hard mask. This etching process is typically carried out at conditions of, for example: $CF_4$ gas: 90 sccm, He gas: 200 sccm, pressure: 8 Pa, and RF power: 600 W. A time point when a silicon plasma luminescence emitted by exposing the surface of the silicon substrate 101 is detected is defined as an end point of the etching. In the case of etching under the condition described above, the etch time is typically about 50 sec. In addition, in the present embodiment, after detecting the end point of the etching, over etching is additionally conducted for a duration time, which is equivalent to about 10% (for example, 5% to 15%) of the time required for completing the process from the start of the etching to the detected end point of the etching. Therefore, the silicon oxide film 131 of the surface of the silicon substrate 101 can more surely be removed. In this case, an etch rate for etching the silicon nitride film 132 is 150 nm/min. and an etch rate for etching the silicon oxide film 131 is 200 nm/min., while an etch rate for etching the silicon substrate 101 is 70 nm/min. In other words, the following relationship is satisfied:

$$2 \leq V_1/V_2 \leq 3$$

where $V_1$ represents an etch rate for etching the silicon nitride film 132 and the silicon oxide film 131 as mask films and $V_2$ represents an etch rate for etching the semiconductor substrate 101. Here, if $V_1/V_2$ is equal to or more than 2, the silicon oxide film 131 can be surely removed, and if $V_1/V_2$ is equal to or less than 3, a possibility that etched off the surface of the silicon substrate 101 can be lower. In other words, almost no surface of the silicon substrate 101 is etched even if the over etch is carried out, and the original thickness of the silicon substrate 101 is maintained as it is.

Figure 2C:
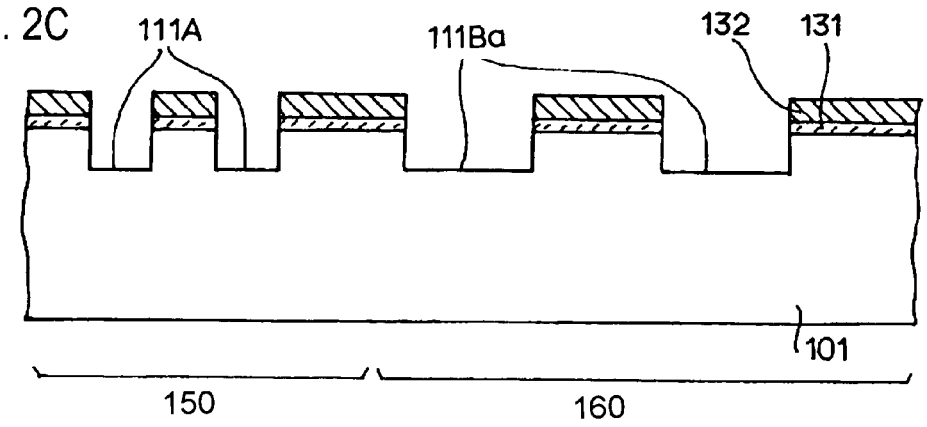

Then, as shown in FIG. 2C, the first photo resist patterns 133 are stripped, and thereafter, the silicon substrate 101 is plasma etched to a predetermined depth through a hard mask of the remaining silicon nitride films 132 to form trenches 111A and trenches 111Ba in the cell region 150 and the peripheral region 160, respectively. This Etching process is typically carried out via a plasma etching process at a condition of, for example: HBr gas: 150 sccm, $O_2$ gas: 2 sccm, pressure: 7 Pa, and RF power: 600 W. In this occasion, etching is conducted for a predetermined etching time, the depths of the trenches 111A and the trenches 111Ba formed in this process are the shallow trench dimensions of about 150 nm that is same as the depth of the trenches of the STI to be formed in the cell region 150, by controlling the etching time.

Figure 3A:
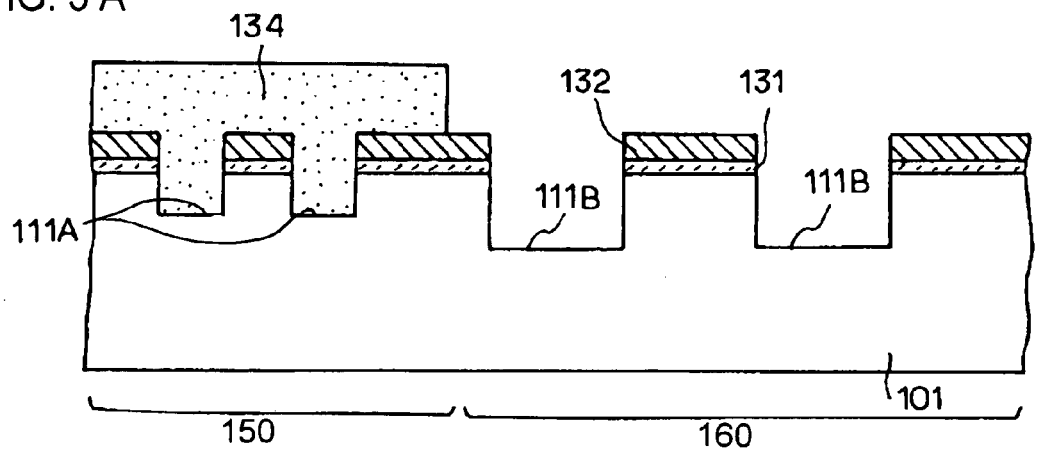
FIGS. 3A to 3C are cross-sectional views of a semiconductor device according to the first embodiment of the present invention, showing a manufacturing process for the semiconductor device according to the first embodiment.

Successively, as shown in FIG. 3A, a second photo resist pattern 134 for covering the cell region 150 is formed so as to expose only the peripheral region 160. Then, a part of the silicon substrate 101 in the peripheral region 160 is etched via, for example, plasma etching, through the mask of the second photo resist pattern 134 and the silicon nitride films 132, and then exposed surfaces of the silicon substrate 101 within the trenches 111Ba in the peripheral region 160 formed via the above-described process are etched to a further depth to form trenches 111B having deeper trench dimensions of about 300 nm. This second etch process for the trenches is conducted under the conditions same as that for the above-described first trench etch process, and the etching time is controlled so as to adjust to the predetermined etch time. Thereafter, the second photo resist pattern 134 is stripped to form the shallower trenches 111A in the cell region 150 and the deeper trenches 111B being deeper than the shallow trench 111A in the peripheral region 160, on the surface of the silicon substrate 101.

Figure 3B:
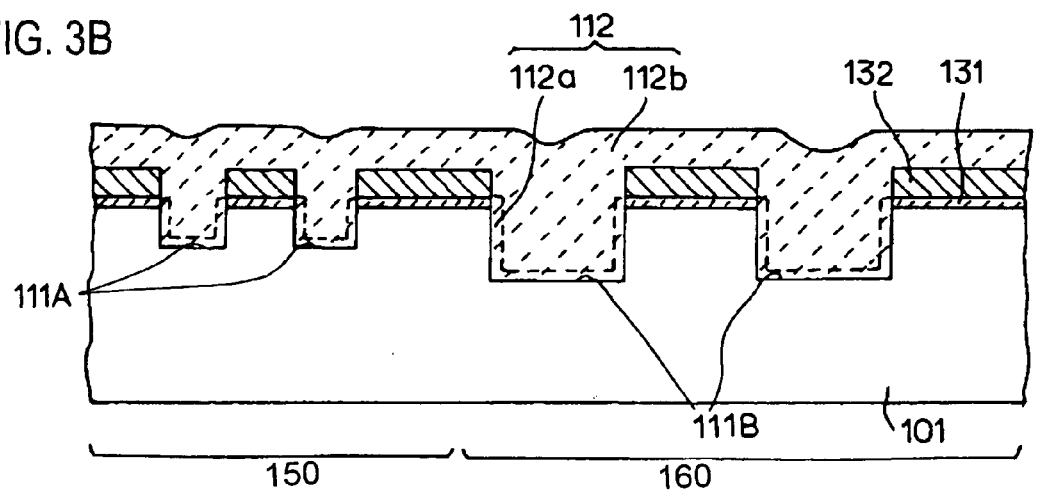

Then, as shown in FIG. 3B, a silicon oxide film 112a having a thickness of about 20 nm is formed on the inside surfaces of the trenches 111A and the trenches 111B by conducting a second oxidizing process for the surface of the silicon substrate 101. In this case, since the silicon oxide film 131 is disposed directly under the silicon nitride film 132, the stress occurred by the oxidization of the surface of the silicon substrate 101 directly under the silicon nitride film 132 during the second oxidization process is relaxed by the presence of the silicon oxide film 131, thereby allowing to avoid the defect generation in the silicon substrate 101. Further, a CVD silicon oxide film 112b is formed on the entire surface of the silicon substrate 101 to a thickness of about 500 nm via a CVD process or the like to fill the trenches 111A and the trenches 111B with the silicon oxide film 112 (i.e., multilayered film of 112a and 112b). Simultaneously, the silicon nitride films 132 are also embedded within the silicon oxide film 112.

Figure 3C:
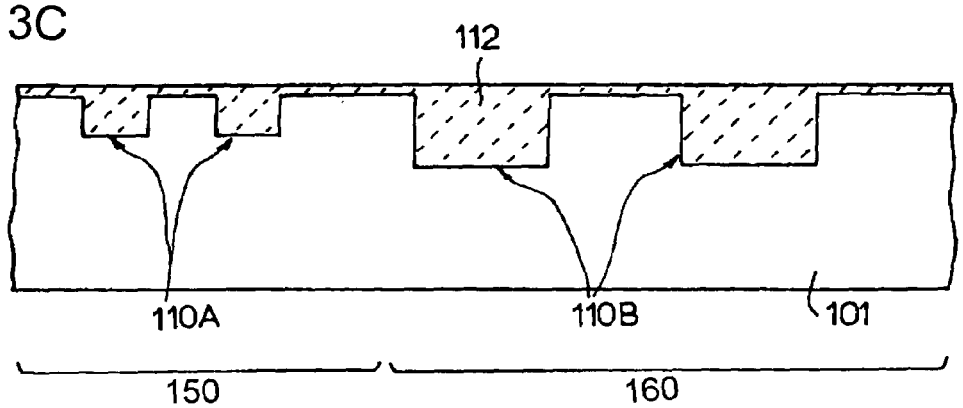

Subsequently, the silicon oxide film 112 on the surface of the silicon substrate 101 is polished via a chemical mechanical polishing (CMP) by utilizing the silicon nitride films 132 as a stopper to provide a flat surface of the silicon substrate 101, though the illustration of the detailed process is not shown. Further, the portions of the silicon oxide film 112 remaining in the spacings between the silicon nitride films 132 are partially removed via a wet etch. In this occasion, it is designed that the silicon oxide film 112 still covers the surface of the silicon substrate 101 at a small thickness after the wet etch. Thereafter, the silicon nitride film 132 is etched off, and thus STI 110A composed of shallower trenches are formed in the cell region 150, and STI 110B composed of deeper trenches are formed in the peripheral region 160, as shown in FIG. 3C. Thereafter, MOS transistors QH and QL, which are devices comprising gate insulating films 102, gate electrodes 103 and source-drain diffusion layers 104, are formed on the surface of the silicon substrate 101 in the device formation region where the region is divided by the STI 110A and the STI 110B by the process similar to the above described process, and further, interlayer insulating films 105, buried contacts 106 and metal interconnects 107 are formed to complete the memory device 100 shown in FIG. 1.

Advantageous effects being obtainable by the present embodiment will be described as follows.

The method for manufacturing the semiconductor device according to the present embodiment involves that, when the silicon nitride film 132 as the hard mask is first patterned and the portions of the silicon oxide film 131 underlying thereof are simultaneously etched off to expose (open) the surfaces of the silicon substrate 101 at locations for forming trenches. Therefore, when the shallower trenches 111A are formed in the first trench etch process of FIG. 2C, the etch process is started from the surface of the silicon substrate 101, and thus the shallower trench 111A can be formed with higher dimension accuracy in the depth direction by conducting the etching under the controlled predetermined conditions. More specifically, unlikely as in the conventional method illustrated in FIGS. 8A to 8D and FIGS. 9A to 9D, the PSG film and the silicon oxide film existing on the surface of the silicon substrate are not etched simultaneously with the silicon substrate, and thus the variation of the dimension of the trenches in the depth direction, which is a factor for causing variations in the film thicknesses of the PSG film and the silicon oxide film, can be inhibited. Similarly, when the deeper trenches 111B that are deeper than the shallower trenches 111A are formed in the second trench etch process of FIG. 3A, the etch is started from the bottom surfaces of the shallower trenches 111Ba that have been formed in the previous process with higher dimension accuracy, and thus the deeper trench 111B can be formed with higher dimension accuracy in the depth direction by conducting the etch under the controlled predetermined condition. Because of this, the shallower STI 110A can be formed with highly precise depth dimension particularly in the cell region 150, and thus it is preferable in achieving the miniaturization in the cell region 150. On the other hand, the deeper STI 110B can be formed in the peripheral region 160 that utilizes higher voltage, and thus better breakdown voltage resistance for device isolation at higher voltage as designed can be obtained.

In addition, while the alignment of the first photo resist pattern 133 with higher alignment accuracy is required for etching the hard mask of the silicon nitride film 132 in the method for manufacturing the semiconductor device according to the present embodiment, the higher alignment accuracy is not required for the second photo resist pattern 134, since the purpose of the second photo resist pattern 134 is to just cover the cell region 150, and thus highly precise alignment for the hard mask is not required. Therefore, the alignment of the second photo resist pattern 134 and formation thereof can easily be carried out.

SECOND EMBODIMENT

Figure 4:
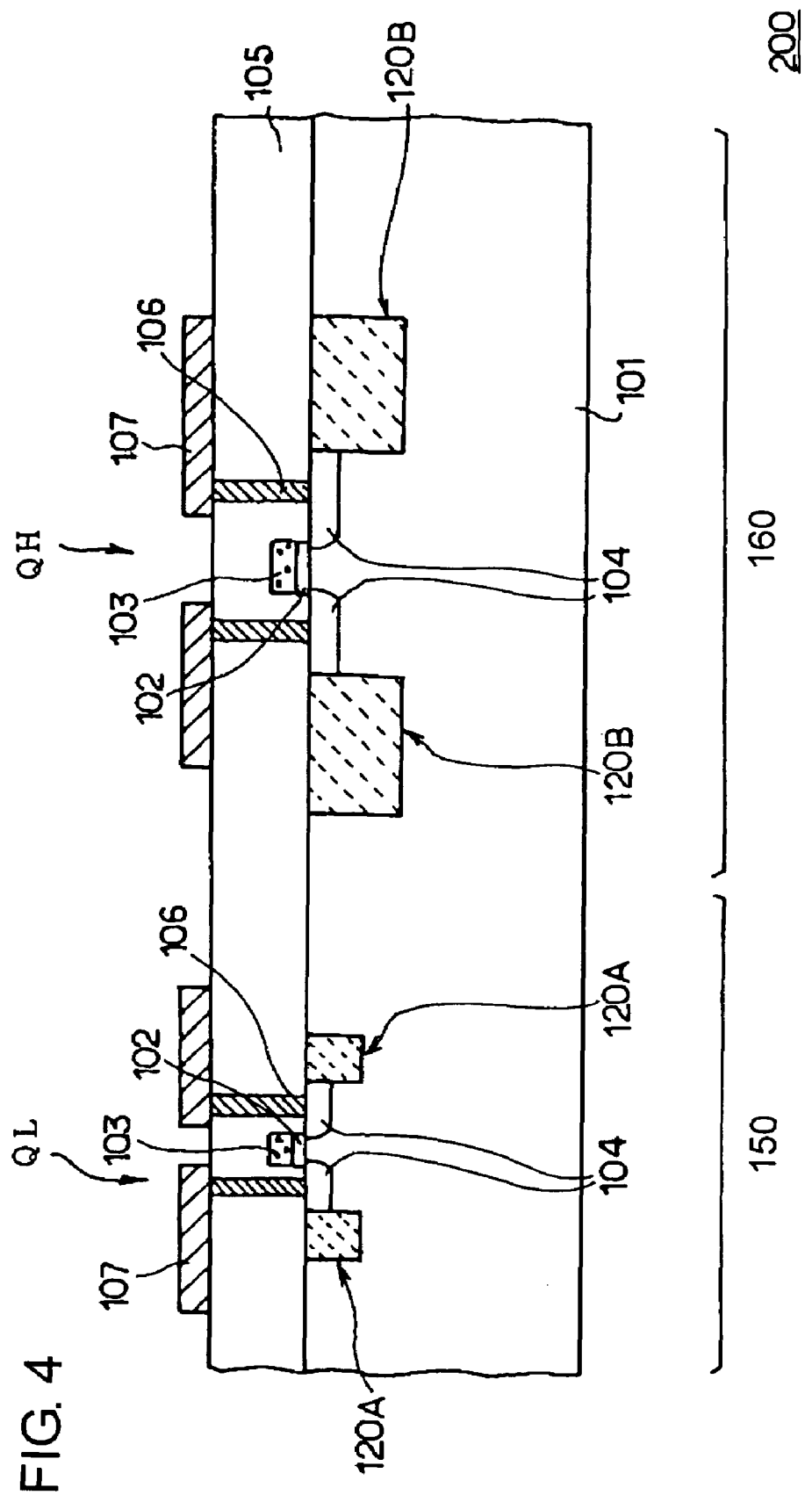
FIG. 4 is a cross-sectional view of a semiconductor device according to the second embodiment of the present invention.

Next, a semiconductor device according to the present embodiment will be described in reference to the annexed figures as follows. FIG. 4 is a schematic cross-sectional view of a semiconductor device according to the present embodiment, and illustrates an example of applying the present invention to a memory device 200 similarly as in the first embodiment. As describing with assigning the same numeral for the equivalent element shown in the first embodiment, a peripheral region 160 is provided in a portion of a silicon substrate 101 and a cell region 150 composed of a memory cell is provided in other portion thereof. A higher breakdown voltage resistance MOS transistor QH is formed in the peripheral region 160, as a device that is driven at higher source voltage, and a cell MOS transistor QL is formed in the cell region 150, which is driven at lower source voltage than that of higher breakdown voltage resistance of MOS transistor QH. The structures of these MOS transistors are similar to the structures of MOS transistors described the first embodiment.

Here in the second embodiment, STI 120A and STI 120B for isolating the respective devices are formed in the cell region 150 and in the peripheral region 160, respectively, and the relatively shallower STI 120A is formed in the cell region 150, and the relatively deeper STI 120B is formed in the peripheral region 160. Here, the STI 120A and the STI 120B in the second embodiment are formed to have narrower widths than the STI 110A and STI 110B that are described in the first embodiment, respectively, and in particular, it is characterized in that the STI 120A in the cell region 150 is formed so as to have the narrower width dimensions than the resolution of the photolithography technology.

FIGS. 5A to 5C and FIGS. 6A to 6C are cross sectional views, showing the process sequence of the method for manufacturing the memory device 200 shown in FIG. 4 according to the second embodiment. Here, the same numeral is also assigned to the equivalent element appeared in the first embodiment in the following illustration.

Figure 5A:
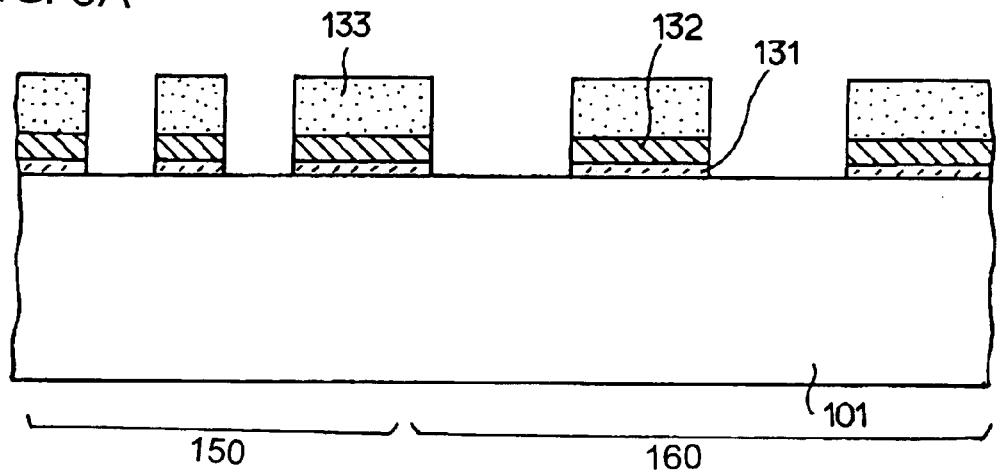
FIGS. 5A to 5C are cross-sectional views of a semiconductor device according to the second embodiment of the present invention, showing a manufacturing process for the semiconductor device according to the second embodiment.

First, as shown in FIG. 5A, a thin silicon oxide film 131 having a thickness of about 10 nm is formed on the surface of the silicon substrate 101 via a first oxidation process, and a silicon nitride film 132 having a thickness of about 150 nm is formed thereon via a CVD process. Then, a first photo resist pattern 133 having openings provided therein that will be regions for forming the STI is formed on the silicon nitride film 132. Spacing of the openings in the first photo resist pattern 133 may be about 150 nm in the cell region 150, and may be at least about 300 nm in the peripheral region 160. Then, the silicon nitride film 132 and the silicon oxide film 131 are sequentially etched off thorough a mask of the first photo resist pattern 133 via a plasma etching to form a hard mask. The process conditions for etching are similar to that of the first embodiment, and after detecting the end point of the etching, over etching is conducted for about 10% of the etch duration time in the etching process, similarly as in the first embodiment. Because of this, the silicon oxide film 131 of the surface of the silicon substrate 101 can surely be removed, and almost no surface of the silicon substrate 101 is etched even if the over etch is carried out, and the original thickness of the silicon substrate 101 is maintained as it is.

Figure 5B:
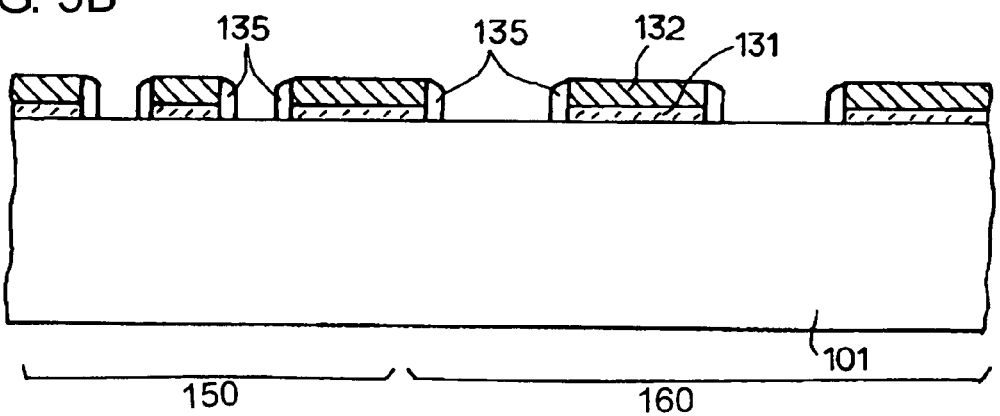

Then, as shown in FIG. 5B, the first photo resist pattern 133 is stripped, and thereafter, a nondoped silicate glass (NSG) film is grown and applied over the entire surface of the silicon substrate 101 and the silicon nitride film 132. In this case, the thickness of the NSG film is about 50 nm. Subsequently, a dry anisotropic etching such as a plasma etching or the like is conducted to etch back the NSG film. Because of this, side walls 135 having a thickness in horizontal direction of about 40 nm are formed to cover the side surfaces of the silicon nitride film 132 and the silicon oxide film 131, and the formed side walls 135 reduces the spacings between the adjacent silicon nitride films 132 or spacing between the adjacent silicon oxide films 131, or in other words, reduces the widths of the openings. In the present embodiment, the previous width dimension of the opening in the cell region 150 before the side walls 135 are formed is about 150 nm, and therefore the width of the opening after the side walls are formed is about 70 nm. Further, the previous width of the opening in the peripheral region 160 before side walls 135 are formed is about 300 nm, and thus the width of the opening is about 220 nm. Therefore, the width of the opening can be reduced to about half thereof, particularly in the cell region 150. Here, the width of the opening can be designed to have a dimension of not wider than the resolution of the photolithography technology utilizing the first photo resist pattern 133.

Figure 5C:
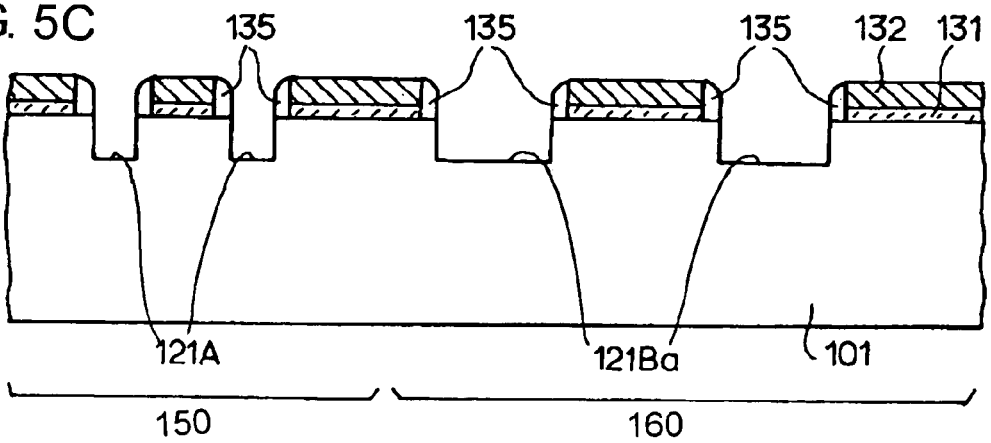

Then, as shown in FIG. 5C, the silicon substrate 101 is plasma etched to a predetermined depth through a hard mask that contains the silicon nitride film 132 having the widths of the openings reduced by the side walls 135 to form trenches 121A and trenches 121Ba. Conditions for the first trench etch is similar to that in the first embodiment. In this occasion, etching is conducted for a predetermined etching time, the depths of the trenches 121A and the trenches 121Ba formed by the etching process can have the shallow trench dimensions of about 150 nm that is same as the depth of the trench of the STI to be formed in the cell region 150, by suitably controlling the etching time.

Figure 6A:
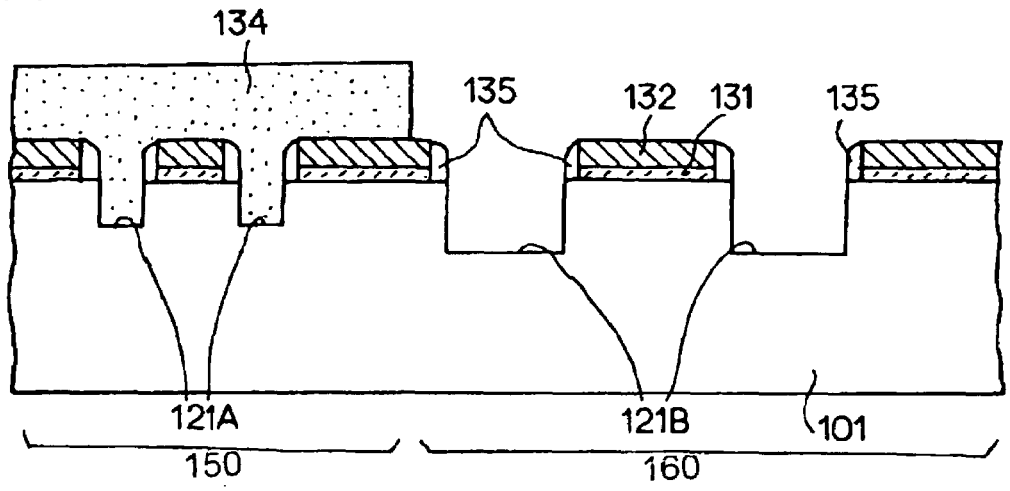
FIGS. 6A to 6C are cross-sectional views of a semiconductor device according to the second embodiment of the present invention, showing a manufacturing process for the semiconductor device according to the second embodiment.

Successively, as shown in FIG. 6A, a second photo resist pattern 134 for covering the cell region 150 is formed so as to expose only the peripheral region 160. Then, the exposed surfaces of the silicon substrate 101 in the peripheral region 160 are etched via a plasma etching, through the mask of the second photo resist pattern 134 and the silicon nitride film 132. Further, the trenches 121Ba in the peripheral region 160 formed via the above-described process are etched to a further depth to form the trenches 121B having a deeper trench dimension of about 300 nm and being deeper than the trench 121Ba of the deep trench dimension. This second etch process conditions for the trenches are identical to the conditions utilized in the above-described first embodiment, and the etching time is suitably controlled so as to be within the predetermined etch time. Thereafter, the second photo resist pattern 134 is stripped to form the shallower trenches 121A in the cell region 150 and the deeper trenches 121B being deeper than the shallow trench 121A in the peripheral region 160, on the surface of the silicon substrate 101.

Figure 6B:
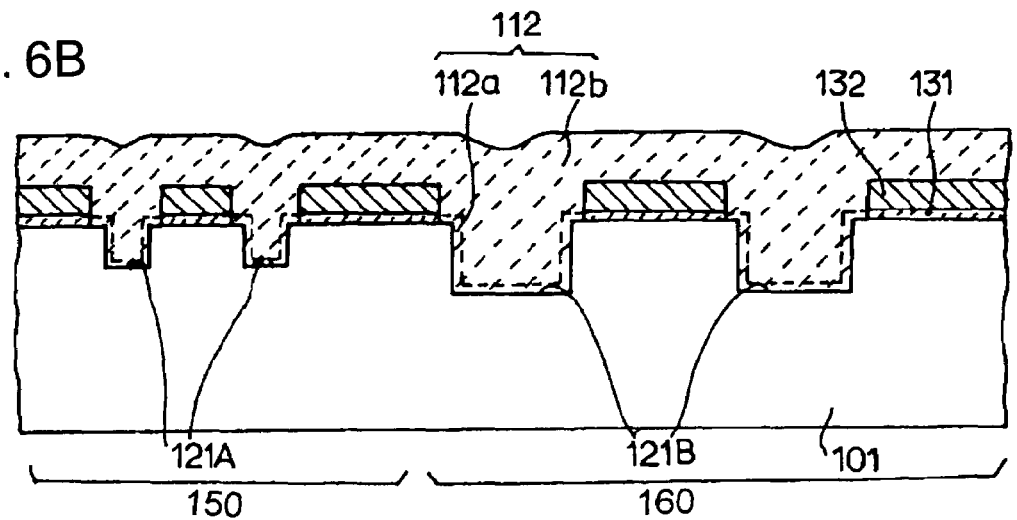

Then, as shown in FIG. 6B, after the side walls 135 are etched off, a silicon oxide film 112a having a thickness of about 20 nm is formed on the inside surfaces of the trenches 121A and the trenches 121B by conducting a (second) oxidizing process conducted on the surface of the silicon substrate 101. Further, a CVD silicon oxide film 112b is formed over the entire surface of the silicon substrate 101 to a thickness of about 500 nm via a CVD process to fill the trenches 121A and the trenches 121B with the silicon oxide film 112 (i.e., multilayered film of 112a and 112b). Simultaneously, the silicon nitride films 132 are also embedded therein.

Figure 6C:
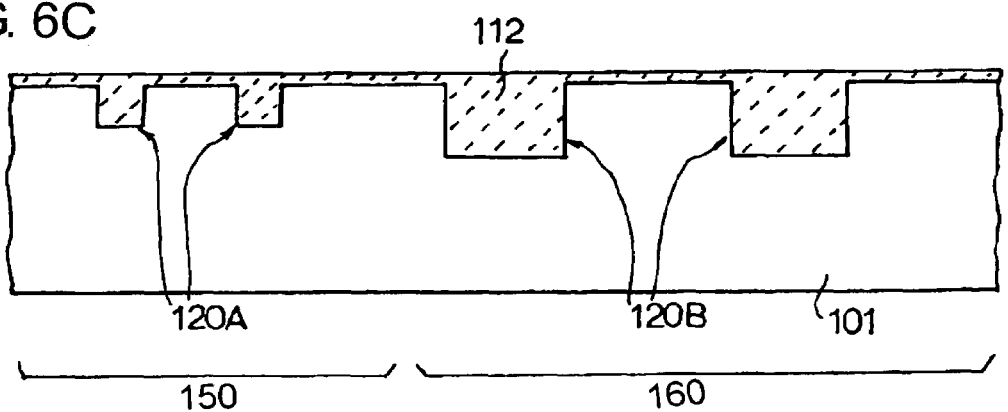
Figure 8A:
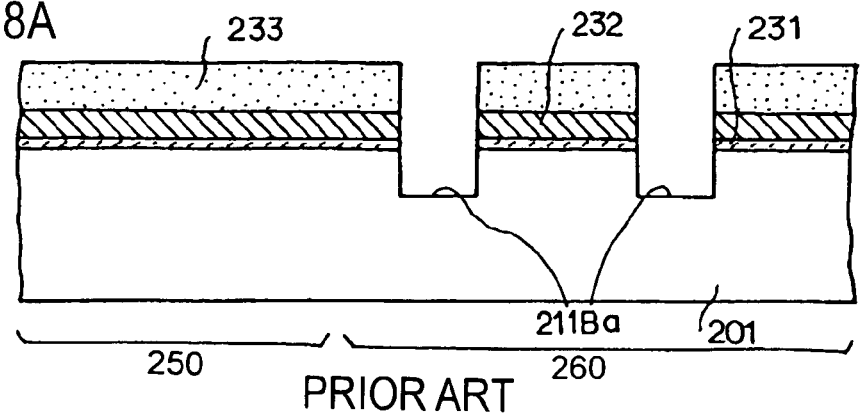
FIGS. 8A to 8D are cross-sectional views of a semiconductor device according to a prior art, showing a manufacturing process for the semiconductor device according to a prior art.
Figure 8B:
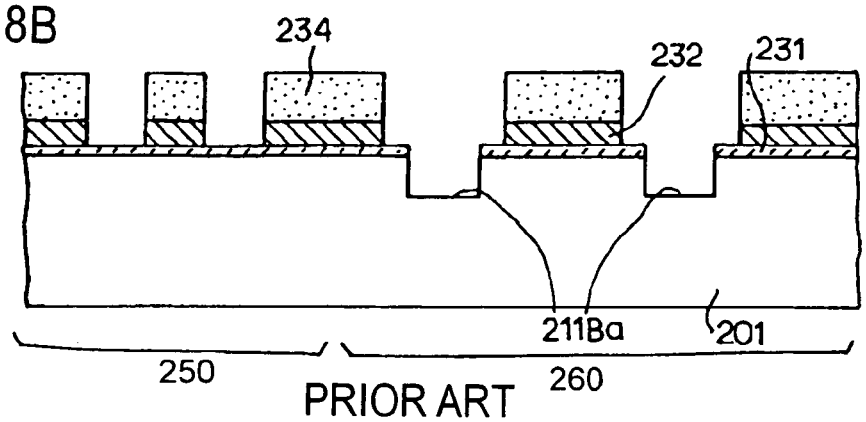
Figure 8C:
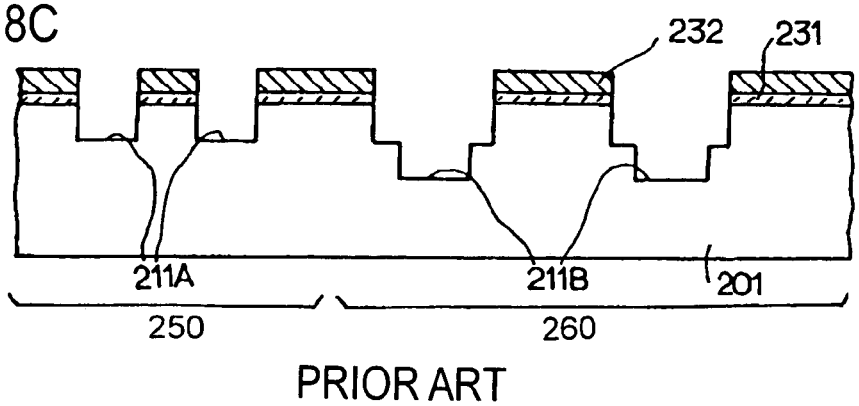
Figure 8D:
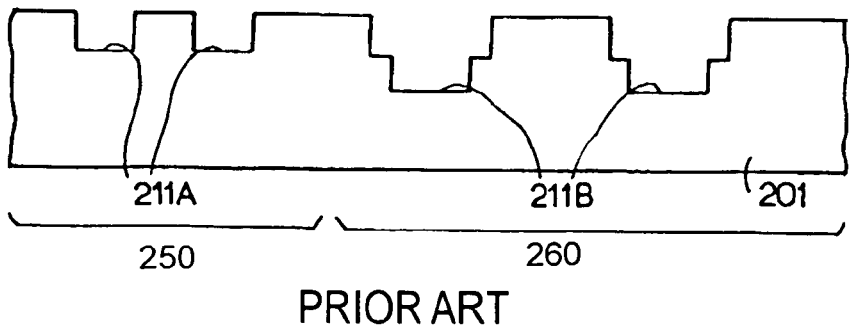
Figure 9A:
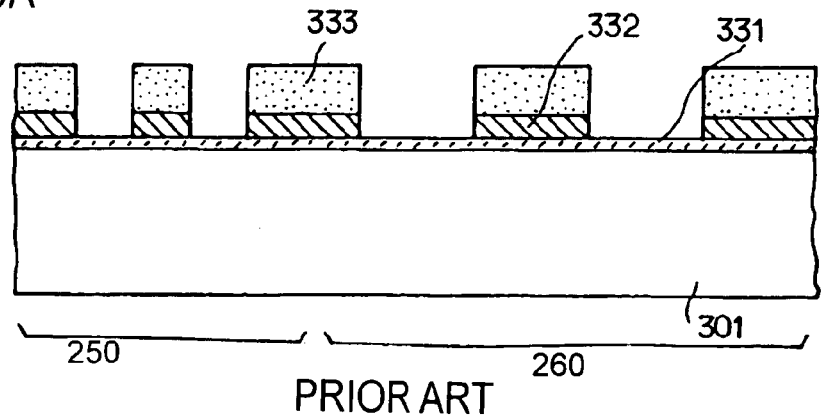
FIGS. 9A to 9D are cross-sectional views of a semiconductor device according to a prior art, showing a manufacturing process for the semiconductor device according to a prior art.
Figure 9B:
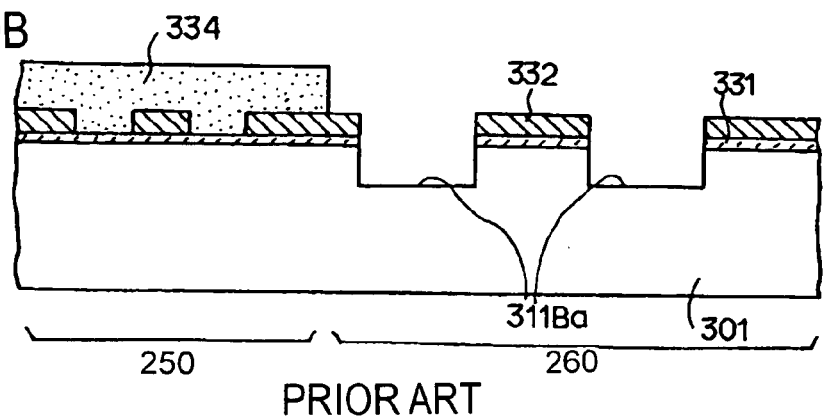
Figure 9C:
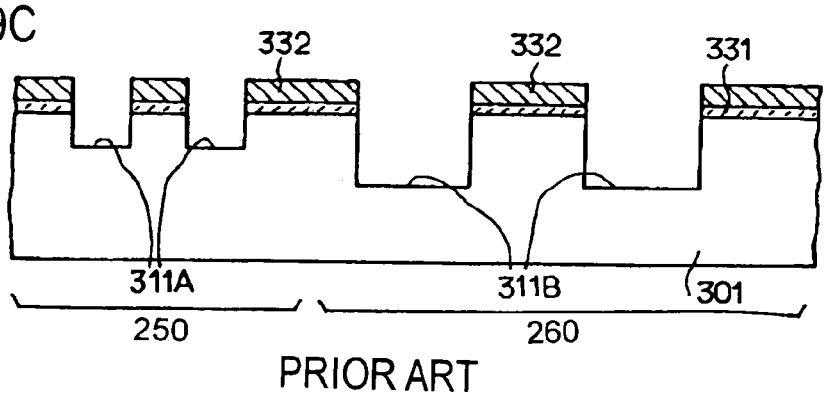
Figure 9D:
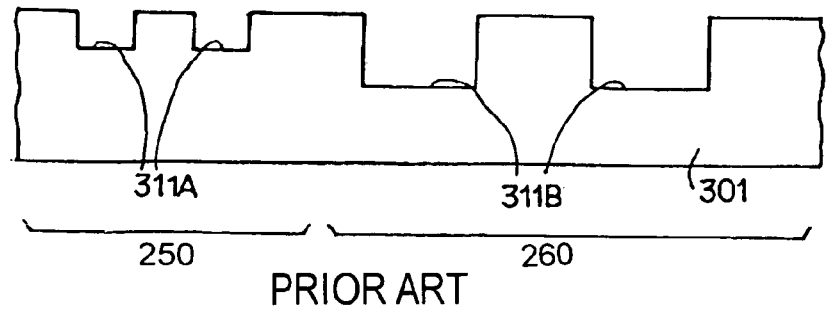

Next, the silicon oxide film 112 on the surface of the silicon substrate 101 is polished via a CMP by utilizing the silicon nitride films 132 as a stopper to provide a flat surface, though the illustration of the detailed process is not shown. Further, the portions of the silicon oxide film 112 remaining in the spacings between the silicon nitride films 132 are partially removed via a wet etch. In this occasion, it is designed that the silicon oxide film 112 still covers the region of the surface of the silicon substrate 101 where the trenches 121A and the trenches 121B are not formed, at a small thickness after the wet etch. Thereafter, the silicon nitride film 132 is etched off, and thus STI 120A composed of the shallower trenches is formed in the cell region 150, and STI 120B composed of the deeper trenches is formed in the peripheral region 160, as shown in FIG. 6C. In addition, in the cell region 150, the STI 120A can be formed to have a width dimension of about 70 nm, which is not wider than the resolution of the photo resist pattern. Therefore, it is advantageous to achieve the miniaturization for the cell region 150. Thereafter, MOS transistor QH and MOS transistor QL, both of which are devices comprising gate insulating films 102, gate electrodes 103 and source-drain diffusion layers 104, are formed in the device formation region where the region is divided by the STI 120A and the STI 120B by the process similar to the above described process, and further, interlayer insulating films 105, burried contacts 106 and metal interconnects 107 and the like are formed to complete the memory device 200 shown in FIG. 4.

Advantageous effects being obtainable by the present embodiment will be described as follows.

The semiconductor device according to the present embodiment involves that, when the silicon nitride film 132 as the hard mask is first patterned, the silicon oxide film 131 disposed underlying thereof is simultaneously etched off to partially expose (open) the surface of the silicon substrate 101 within the openings, similarly as in the first embodiment. Therefore, during the first trench etch process for forming the shallower trench, the etch is started from the surface of the silicon substrate 101, and thus the shallower trench 121A can be formed with higher dimension accuracy by conducting the etching under the controlled predetermined condition. In addition, when the deeper trenches are formed in the second trench etch process of FIG. 3C, the etch is started from the bottom surfaces of the shallower trenches 121Ba that are formed with higher dimension accuracy, and thus the deeper trenches 121B can be formed with higher dimension accuracy by conducting the etching under the controlled predetermined condition. Because of this, the shallower STI 120A can be formed with highly precise depth dimension and with a width dimension equal to or less than the resolution of the photolithography technology particularly in the cell region 150, and thus it is preferable in achieving the miniaturization in the cell region 150. On the other hand, the deeper STI 120B can be formed in the peripheral region 160 that utilizes higher voltage, and thus better breakdown voltage resistance for device isolation at higher voltage as designed can be obtained.

Further, while the alignment of the first photo resist pattern 133 with higher alignment accuracy is required for etching the hard mask of the silicon nitride film 132 in the method for manufacturing the semiconductor device according to the present embodiment, the higher alignment accuracy is not required for the second photo resist pattern 134, since the purpose of the second photo resist pattern 134 is to just cover the cell region 150. Therefore, highly precise alignment for the hard mask is not required and thus, the alignment of the second photo resist pattern 134 and formation thereof can easily be carried out.

THIRD EMBODIMENT

FIGS. 7A to 7D are cross sectional views, showing the process sequence of the method for manufacturing the memory device shown in FIG. 1 according to the present embodiment, which is manufactured by a different process from the process described in the first embodiment. First, as shown in FIG. 7A, a thin silicon oxide film 131 having a thickness of about 10 nm is formed on the surface of the silicon substrate 101 via a first oxidation process, and a silicon nitride film 132 having a thickness of about 150 nm is formed thereon via a nitridation process. Then, a first photo resist pattern 133A having openings disposed only in the locations for forming STI in the cell region 150 is formed on the silicon nitride film 132. The opening widths of the windows in the first photo resist pattern 133A are about 150 nm. Then, the silicon nitride film 132 and the silicon oxide film 131 are sequentially etched off thorough a mask of the first photo resist pattern 133A via a plasma etching to form a first hard mask. Conditions for this etching are the same as that employed in the first embodiment. Additionally, an over etching is carried out to surely remove the silicon oxide film 131 of the surface of the silicon substrate 101, and almost no surface of the silicon substrate 101 is etched even if the over etching is carried out, and the thickness of the original silicon substrate 101 is maintained as it is, similarly as in the previous embodiments.

Then, as shown in FIG. 7B, the first photo resist pattern 133A is stripped, and thereafter, the silicon substrate 101 is plasma etched to a predetermined depth through the first hard mask of the remaining silicon nitride film 132 to form shallower trenches 111A. The first trench etch process is the same as that in the first embodiment. This provides shallower trenches 111A having depths of about 150 nm only in the cell region 150.

Then, as shown in FIG. 7C, a second photo resist pattern 134A, which has openings exposing the locations for forming the STI in the peripheral region 160 while covers the entire cell region 150, is formed. The opening width in the second photo resist pattern 134A is about 300 nm at least. Then, the silicon nitride film 132 and the silicon oxide film 131 are sequentially etched off thorough a mask of the second photo resist pattern 134 via a plasma etching to form a second hard mask. Conditions for this etching are the same as that in the first embodiment. In this case, an over etching process is also conducted to surely remove the silicon oxide film 131 from the surface of the silicon substrate 101.

Then, as shown in FIG. 7D, the silicon substrate 101 is plasma etched to a predetermined depth through the second photo resist pattern 134A and the second hard mask to form the trenches 111B being deeper than the shallower trench 111A in the peripheral region 160. While the second trench etch process is almost same as the first trench etch process, the etch time for the second trench etch process is set to be longer than that for the first trench etch process. This provides deeper trenches 111B having depths of about 300 nm only in the peripheral region 160.

As such, the shallower trenches 111A are formed in the cell region 150 and the deeper trenches 111B are formed in the peripheral region 160. Then, after removing the second photo resist pattern 134A, as shown in FIGS. 3B to 3C for the first embodiment, internal portions of the respective trenches 111A and 111B are filled with the silicon oxide film 112, and further the filled surface is planarized via a CMP to form STI having different depths. Thus, the memory device shown in FIG. 1 can be manufactured.

Advantageous effects being obtainable by the present embodiment will be described as follows.

The present embodiment involves that, when the silicon nitride film 132 as the hard mask is first patterned, the silicon oxide film 131 disposed underlying thereof is simultaneously etched off to expose (open) the surface of the silicon substrate 101 within the openings, similarly as in the first embodiment. Therefore, in either of the first trench etch process for forming the shallower trench 111A or the second trench etch process for forming the deeper trench 111B, the etch is started from the exposed surfaces of the silicon substrate 101, and thus the shallower trench 111A and the deeper trench 111B can be formed with higher accuracy by conducting the trench etching under the controlled predetermined conditions. Because of this, the shallower STI 110A can be formed with highly precise depth dimension particularly in the cell region 150, and thus it is preferable in achieving the miniaturization in the cell region 150. On the other hand, the deeper STI 110B can be formed in the peripheral region 160 that utilizes higher voltage, and thus better breakdown voltage resistance for device isolation at higher voltage as designed can be obtained.

However, since highly accurate alignment for the first photo resist pattern 133A and the second photo resist pattern 134A is required when the locations for forming the STI in the cell region 150 and the peripheral region 160 are determined in the present embodiment, the technology of the present embodiment is preferably applicable to semiconductor devices, which requires lower level of the dimension accuracy than the semiconductor devices that are manufactured by the methods for manufacturing the semiconductor device described in the first embodiment or the second embodiment.

While the present invention has been described in reference to the preferred embodiments, it is apparent to those skilled in the art that the disclosures contained herein are for the purposes of illustrating the present invention only, and other configurations of the structures or processes may be suitably employed without departing from the scope and spirits of the invention.

For example, while examples of forming the shallower trenches for the shallower STI in the cell region 150 and forming the deeper trenches for the deeper STI in the peripheral region 160 are presented in respective embodiments, the present invention is not limited to the aforementioned trenches for the above-mentioned STI, provided that semiconductor device is required to have the trenches having different depths in one substrate. For example, the present invention may be applicable to the case of forming trenches for forming so-called "dual damascene" interconnect, which is embedded within the interlayer insulating film to be utilized for providing an electrical coupling to the underlying interconnects.

In addition, the above-described embodiments are for providing illustrations of the present invention only, and for example, the silicon nitride film as a hard mask and the silicon oxide film underlying thereof may be replaced with films of other materials. Further, it is needless to say that the etching conditions for forming the hard mask or the etching conditions for forming the trenches in the above-described embodiments may be suitably selected, corresponding to the materials employed.

While the above-mentioned embodiments illustrates that after detecting the end point of the etching, the over etch is conducted for about 10% (for example, 5% to 15%) of the time required for completing the process from the start of the etching to the detected end point of the etching in the process for forming the hard mask, the etching process may be completed without conducting the over etching.

In addition, while the above-described embodiments illustrates the configuration, in which the entire surfaces of the exposed surfaces of the silicon substrate 101 within a plurality of the openings provided by the photo resist pattern are etched to form the trenches, some portions of the exposed surface of the silicon substrate 101 through a plurality of the openings may be partially etched to form the trenches.

It is apparent that the present invention is not limited to the above embodiment, that may be modified and changed without departing from the scope and spirit of the invention.

What is claimed is:

1. A method for manufacturing a semiconductor device, comprising:

forming a first film comprising a plurality of opening patterns on a surface of a semiconductor substrate;

providing a plurality of the openings in said first film to expose the surface of said semiconductor substrate;

etching said semiconductor substrate through said plurality of the openings to form a first isolation trench in a portion of said semiconductor substrate;

covering some of the openings of said plurality of the openings; and further etching at least a portion of the semiconductor substrate, in which said first isolation trench is formed, through some other openings of said plurality of the openings to form a second isolation trench being deeper than said first isolation trench.

2. The method according to claim 1, further comprising:
forming a side wall on a side surface of said plurality of the openings opened in said first film after said providing said plurality of the openings on said first film to expose the surface of said semiconductor substrate and before said etching said semiconductor substrate through said plurality of the openings to form a trench in the portion of said semiconductor substrate, wherein said semiconductor substrate is etched through the opening having a width being reduced by additionally having said side wall thereon.

3. The method according to claim 1, wherein said forming said first film includes forming a silicon oxide film and a silicon nitride film consecutively on the surface of said semiconductor substrate, wherein said providing the openings on said first film includes etching said first film through a first photo resist pattern, and wherein said covering some of said plurality of the openings includes forming a second photo resist pattern on said first film.

4. The method according to claim 2, said forming said side wall includes:
forming a second film on entire surface of said semiconductor substrate; and
conducting an anisotropic etch for the second film previously formed to partially leave said second film only on the side surface of said opening.

5. The method according to claim 1, wherein, in said providing said plurality of the openings on said first film to expose the surface of said semiconductor substrate, the following relationship is satisfied:

$$2 \leq V_1/V_2 \leq 3$$

where $V_1$ represents an etch rate for said first film and $V_2$ represents an etch rate for said semiconductor substrate.

6. The method according to claim 1, wherein a manner of detecting an end point of the etching for said first film is utilized in said providing said plurality of the openings on said first film to expose the surface of said semiconductor substrate, and an over etching thereof is conducted for a predetermined time after detecting the end point of the etching.

7. The method according to claim 1, further comprising:
providing insulating films embedded within said trench and within said deeper trench in said semiconductor substrate having a cell region comprising a cell device and a peripheral region comprising a device having higher resistance to the breakdown voltage to form a device isolation region,
wherein a device isolation film is formed in said trench of said cell region and a device isolation film is formed in said deeper trench of said peripheral region.

8. A method for manufacturing a semiconductor device, comprising: forming a first film having an opening pattern on a surface of a semiconductor substrate; providing an opening in a portion of said first film to expose the surface of said semiconductor substrate; etching a portion of said semiconductor substrate through said opening to form a trench; covering said opening while providing an other opening in one portion of said first film to partially expose a surface of said semiconductor substrate; and etching said semiconductor substrate through said other opening to form a deeper trench than said trench.

9. The method according to claim 8, wherein said forming said first film includes forming a silicon oxide film and a silicon nitride film consecutively on the surface of said semiconductor substrate, wherein providing an opening on a portion of said first film includes etching a portion of said first film through a first photo resist pattern, and wherein said covering said opening and providing said other opening in one portion of said first film to partially expose a surface of said semiconductor substrate includes partially etching other portion of said first film through the second photo resist pattern.

10. The method according to claim 8, wherein, in providing the opening on the portion of said first film, the following relationship is satisfied:

$$2 \leq V_1/V_2 \leq 3$$

where $V_1$ represents an etch rate for said first film and $V_2$ represents an etch rate for said semiconductor substrate.

11. The method according to claim 8, wherein a manner of detecting an end point of the etching for said first film is utilized in providing the opening on the portion of said first film, and an over etching thereof is conducted for a predetermined time after detecting the end point of the etching.

12. The method according to claim 8, further comprising:
providing insulating films embedded within said trench and within said deeper trench in said semiconductor substrate having a cell region comprising a cell device and a peripheral region comprising a device having higher resistance to the breakdown voltage to form a device isolation region, wherein a device isolation film is formed in said trench of said cell region and a device isolation film is formed in said deeper trench of said peripheral region.

13. The method according to claim 1, wherein said forming the first film comprises forming the opening patterns over at least one additional layer, and said removing the opening patterns and etching the semiconductor substrate through the plurality of openings comprises removing the opening patterns from the first film and etching the semiconductor substrate through the plurality of openings provided in the at least one additional layer of the first film.

14. The method according to claim 1, wherein said providing a plurality of the openings on said first film to expose the surface of said semiconductor substrate comprises overetching for complete removal of the first film form the surface of the semiconductor substrate.

15. The method according to claim 1, wherein said providing a plurality of the openings on said first film to expose the surface of said semiconductor substrate comprises overetching for complete removal of the first film from the surface of the semiconductor substrate.

16. A method of manufacturing a semiconductor device, comprising:
forming a first film on a surface of a semiconductor substrate;
patterning a photoresist to form a plurality of openings in said first film and expose the surface of said semiconductor substrate;
removing the photoresist;

etching the semiconductor substrate through the plurality of the openings formed in the first film from which the photoresist was removed, to form an isolation trench in a portion of said semiconductor substrate;

covering some of the openings of said plurality of the openings; and further etching at least a portion of the semiconductor substrate, in which the isolation trench is formed, through other openings of the plurality of the openings to form another isolation trench deeper than the isolation trench.

17. The method according to claim 16, wherein said forming said first film comprises forming a silicon oxide film and a silicon nitride film consecutively on the surface of said semiconductor substrate;

wherein said patterning comprises etching a portion of said first film through the photoresist, and wherein said further etching comprises partially etching another portion of said first film through a second photoresist.

18. The method according to claim 16, wherein, in said patterning and said etching, the following relationship is satisfied:

$$2 \leq V_1/V_2 \leq 3$$

where $V_1$ represents an etch rate for said first film and $V_2$ represents an etch rate for said semiconductor substrate.

19. The method according to claim 16, wherein a manner of detecting an end point of the etching for said first film is utilized in providing the opening on the portion of said first film, and an over etching thereof is conducted for a predetermined time after detecting the end point of the etching.

20. The method according to claim 16, further comprising:

embedding insulating films within said isolation trench and within said another isolation trench in said semiconductor substrate, said semiconductor substrate having a cell region comprising a cell device and a peripheral region comprising a device having higher resistance to a breakdown voltage to form a device isolation region, wherein a device isolation film is formed in said isolation trench of said cell region and a device isolation film is formed in said another isolation trench of said peripheral region.

* * * * *